United States Patent [19]

Shiomi et al.

[11] Patent Number: 5,252,687
[45] Date of Patent: Oct. 12, 1993

[54] THERMOSETTING RESIN COMPOSITION AND USE THEREOF FOR AN ELECTRONIC PART

[75] Inventors: Yutaka Shiomi; Shigeki Naitoh; Yasuhiro Hirano; Kazuo Takebe, all of Ibaraki, Japan

[73] Assignee: Sumitomo Chemical Company, Limited, Osaka, Japan

[21] Appl. No.: 677,451

[22] Filed: Mar. 29, 1991

[30] Foreign Application Priority Data

Mar. 29, 1990 [JP] Japan .................... 2-84528

[51] Int. Cl.$^5$ ........................... C08F 283/04
[52] U.S. Cl. ........................ 525/502; 525/504
[58] Field of Search ...................... 525/502, 504

[56] References Cited

U.S. PATENT DOCUMENTS

| | | |
|---|---|---|
| 3,763,081 | 10/1973 | Holub et al. |
| 4,100,104 | 7/1978 | Zahir et al. ............ 526/90 |
| 4,100,104 | 7/1978 | Zahir et al. ............ 526/90 |

FOREIGN PATENT DOCUMENTS

| | | |
|---|---|---|
| 0178546 | 4/1986 | European Pat. Off. |
| 0372775 | 6/1990 | European Pat. Off. |
| 56-50900 | 5/1981 | Japan |
| 2170812A | 7/1990 | Japan |
| 2219593A | 12/1989 | United Kingdom |

Primary Examiner—Melvyn I. Marquis
Assistant Examiner—D. Aylward
Attorney, Agent, or Firm—Antonelli, Terry, Stout & Kraus

[57] ABSTRACT

A thermosetting resin composition is provide, which contains a compound of

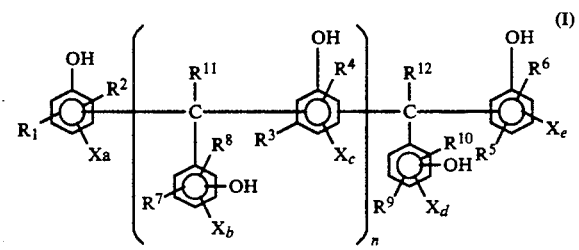

wherein substituents $R_1$-$R_6$ each represents a hydrogen atom or a saturated alkyl group having 1-6 carbon atoms, substituents $R^7$-$R^{12}$ each represents a hydrogen atom, a saturated alkyl group having 1-4 carbon atoms or an alkoxy group having 1-4 carbon atoms, $X_a$-$X_e$ each represents a hydrogen atom, a chlorine atom or a bromine atom, and the average repeating unit number n denotes a numeral from 0 to 5, and a polyamide compound having two or more maleimide groups and, if desired, a compound of

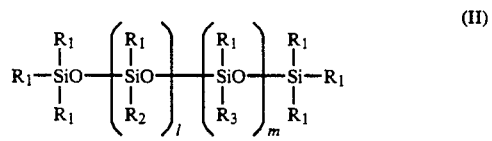

wherein $R_1$ and $R_2$ each represents a methyl group or a phenyl group, and $R_3$ represents a hydrogen atom or a functional group containing an amino group, a glycidyl group or an alicylic epoxy group, l denotes a numeral in the range of 0-500, and m denotes a numeral in the range of 1-500, or

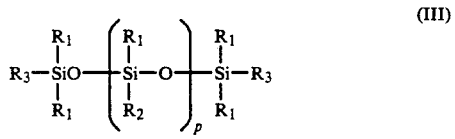

wherein $R_1$ and $R_2$ each represents a methyl group or a phenyl group, and $R_3$ represents a hydrogen atom or a functional group containing an amino group, a glycidyl group or an alicyclic epoxy group, and p denotes a numeral in the range of 0-500. The composition is useful for electronic parts.

2 Claims, No Drawings

THERMOSETTING RESIN COMPOSITION AND USE THEREOF FOR AN ELECTRONIC PART

The present invention relates to a thermosetting resin composition. More particularly, it relates to a thermosetting resin composition excellent in processability and heat resistance and an electronic part with use of it.

Thermosetting resins are used for a variety of electric insulating materials, structural materials, adhesives and the like as materials for casting, impregnation, lamination or molding. Recently, these materials tend to be used for these applications under more restricted conditions, and the materials are required to have heat resistance as an essential property.

Hitherto, thermosetting polyimde resins have been used for such purposes, but heating at high temperature for a long time was required for their processing.

Also, epoxy resins which have been improved in heat resistance are excellent in processability, but they have insufficient heat resistance at high levels such as mechanical properties and electric properties at high temperature and long term heat deterioration characteristics.

As one of alternatives of these materials, there have been proposed, for example, a thermosetting mixture comprising a polyimide, an alkenylphenyl and/or an alkenylphenol ether (Japanese Patent Application Kokai (Laid-Open) No. 994/1977), a heat resistant resin composition comprising a maleimide type compound, a poly-allylated phenol compound and an epoxy resin (Japanese Patent Application Kokai (Laid-Open) No. 134099/1978) and the like.

The polyallylated phenol compound used in the aforementioned composition is prepared from a bicyclic compound or a phenol novolak and thus contains the allyl ether of the bicyclic compound or a Claisen rearrangement product as a volatile component, so that it tends to remain unaltered on the heat curing or even after curing and has problems on its moldability or the curing physical properties or heat deterioration characteristics at high temperature.

From these backgrounds, present inventors conducted researches on resin compositions having an excellent heat resistance and an excellent processability. As a result, they found that a resin composition comprising a certain resin and a maleimide compound served the purpose and thus reached the accomplishment of the present invention.

That is, the present invention is to provide a thermosetting resin composition comprising (A) an allyl etherified compound obtained by allyl etherification of the hydroxyl groups of a polyvalent phenol represented by the following formula (I)

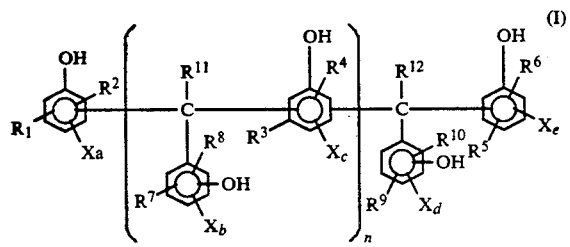

wherein substituent $R^1$-$R^6$ each represents a hydrogen atom or a saturated alkyl group having 1-6 carbon atoms, substituent $R^7$-$R^{12}$ each represents a hydrogen atom, a saturated alkyl group having 1-4 carbon atoms or an alkoxy group having 1-4 carbon atoms, $X_a$-$X_e$ each represents a hydrogen atom, a chlorine atom or a bromine atom, and the average repeating unit number n denotes a numeral from 0 to 5, and (B) a polymaleimide compound containing two or more maleimide groups in the molecule The present invention also provides a thermosetting resin composition comprising silicone resins having the specific structures in addition to the composition containing (A) and (B) above mentioned.

The respective components of present invention are further explained in detail below.

In the formula (I), specific examples of $R^1$, $R^2$, $R^3$, $R^4$, $R^5$ and $R^6$ include preferably a hydrogen atom, a methyl group, an ethyl group, a propyl group, a butyl group, an amyl group, a hexyl group and the like, preferably a hydrogen atom, a methyl group, an ethyl group, a propyl group and a butyl group.

Furthermore, specific examples of $R^7$, $R^8$, $R^9$, $R^{10}$, $R^{11}$ and $R^{12}$ include a hydrogen atom, a methyl group, an ethyl group, a propyl group, a butyl group and a methoxy group, preferably a hydrogen atom, a methoxy group and a methyl group, particularly a hydrogen atom.

The more n is, the higher heat resistance is. However, if it is too large, the melting viscosity of the allyl compound (I) is increased and the processability and moldability thereof are lowered. Thus, n is preferably in the range of 5 or less.

The polyvalent phenol moiety of the formula (I) of the present invention is obtained by condensing an aromatic carbonyl compound represented by the formula (IV) below mentioned and a phenol.

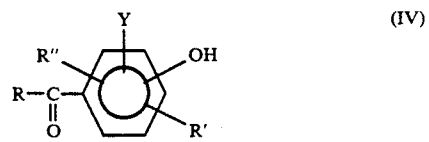

wherein R corresponds to $R^{11}$ or $R^{12}$ in the formula (I), R' and R" correspond to $R^7$, $R^8$, $R^9$ or $R^{10}$ in the formula (I) and Y corresponds to $X_b$ or $X_d$ in the formula formula (I).

Specific examples of the aforementioned aromatic carbonyl compound include hydroxybenzaldehyde, methylhydroxybenzaldehyde, dimethylhydroxybenzaldehyde, methoxyhydroxybenzaldehyde, chlorohydroxybenzaldehyde, bromobenzaldehyde, hydroxyacetophenone, hydroxyphenyl ethyl ketone, hydroxyphenyl butyl ketone and the like, preferably hydroxybenzaldehyde, particularly p-hydroxy-benzaldehyde.

Another carbonyl compound may also be employed in a small amount in combination with said aromatic carbonyl compound. Such a carbonyl compound includes, for example, formaldehyde, acetaldehyde, crotonaldehyde, acrolein, glyoxal and benzaldehyde.

Examples of the phenol include phenol, cresol, ethylphenol, propylphenol, butylphenol, amylphenol, hexylphenol, methylpropylphenol, methylbutylphenol, methylhexylphenol, methylphenylphenol, chlorophenol, bromophenol, chlorocresol, bromocresol and the like, preferably o-cresol.

The condensation of the aromatic carbonyl compound and the phenol is carried out by allowing about 0.5-10 moles of the latter to react with 1 mole of the former at a temperature in the range of 30°-180 °C. in the presence of a well-known acidic catalyst for the synthesis of novolaks, for example, a mineral acid such as hydrochloric acid, sulfuric acid or phosphoric acid, an organic acid such as oxalic acid or toluenesulfonic acid, or a salt such as zinc acetate.

In this connection, an aromatic solvent such as toluene or chlorobenzene may also be used in the condensation.

Moreover, in order to increase the repeating units in the oligomer, it is sufficient that the condensation is carried out with a decreased ratio of the phenol at a higher temperature in the presence of an increased amount of the catalyst.

The polyvalent phenol thus obtained may also be halogenated by a well-known method with chlorine or bromine.

The allyl etherification is conducted by a well-known method for allyl etherification of the phenol. That is, the allyl etherification product is obtained by allowing the condensation product to react with an allyl halide such as allyl chloride, allyl bromide or allyl iodide in the presence of an alkali such as sodium hydroxide. The alkali is used in an equivalent amount to the portion of the phenolic hydroxyl groups which are desired to be allyl etherified. The amount of the allyl halide used is an amount which is equivalent to or more than the amount of the alkali. The allyl etherification rate of the phenolic hydroxyl group is preferably in the range of 20-100 %, more preferably in the range of 30-70 %.

An allyl phenol may be obtained by a method for rearranging the aforementioned allyl etherified phenol by the action of heat (Claisen rearrangement).

As the N,N'-bismaleimide compound used in the present invention, there are mentioned N,N'-diphenyl-methane bismaleimide, N,N'-phenylene bismaleimide, N,N'-diphenyl ether bismaleimide, N.N'-diphenylsulfone bismaleimide, N.N'-dicyclohexylmethane bismaleimide, N,N'-xylene bismaleimide, N,N'-tolylene bismaleimide, N,N'-xylylene bismaleimide, N.N'-diphenylcyclohexane bismaleimide (including isomers, respectively), N,N'-ethylene bismaleimide, N,N'-hexamethylene bis-maleimide and prepolymers having an N,N'-bismaleimide skeleton terminal which are obtained by addition reaction of the N,N'-bismaleimide compounds with a diamine.

In the resin composition of the present invention, particularly the allyl etherified polyvalent phenol has a low melting viscosity, so that it is easily mixed with the bismaleimide resin and thus has an excellent processability. Moreover, the partly allyl etherified polyvalent phenol has phenolic hydroxyl groups and allyl groups, so that it has a high reactivity with the bismaleimide resin and is suited for an encapsulant or the like.

In the resin composition of the present invention, particularly the aromatic nucleus substituted allyl polyvalent phenol which has been obtained by the Claisen rearrangement, in spite of its high melting viscosity, produce a cured product excellent in toughness. Further, the partly aromatic nucleus substituted allyl polyvalent phenol is rapidly curable and thus suited for a molding compound.

In the resin composition of the present invention, the amount ratio of the partly allyl ether substituted phenol novolak resin and the N,N'-bis-maleimide compound is preferably determined so that the ratio of the double bonds in the latter to those in the former is in the range of 2 or less. If the ratio exceeds 2, the content of the unaltered allyl group undesirably increases in the cured product.

In this connection, the N,N'-bismaleimide compound may be preliminarily allowed to react with an allyl group to such an extent that gelation will not be caused.

As silicone resins used in the present invention, there are mentioned those represented by the following formulae (II) or (III):

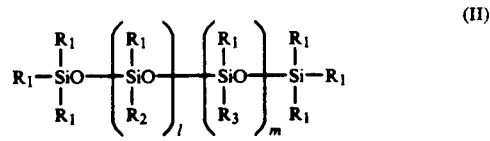

wherein $R_1$ and $R_2$ each represents a methyl group or a phenyl group, and $R_3$ represents a hydrogen atom or a functional group containing an amino group, a glycidyl group or an alicyclic epoxy group, l denotes a numeral in the range of 0-500, preferably 0-150, and m denotes a numeral in the range of 1-500, preferably 0-150, or wherein $R_1$ and $R_2$ each represents a methyl group or a phenyl group, and $R_3$ represents a hydrogen atom or a functional group containing an amino group, a glycidyl group or an alicyclic epoxy group, and p denotes a numeral in the range of 0-500, preferably 0-150.

The silicone resin represented by the formula (II) tends to gel, and thus the one represented by the formula (III) is preferred.

These silicone resins may be used in combination of the two or more.

As the silicone resin wherein $R_3$ represents a hydrogen atom, there are mentioned X-21-7628 manufactured by SINETSU KAGAKU KOGYO K.K and the like; as the one wherein $R_3$ represents a functional group containing an amino group (referred to hereinafter as amino group containing silicone resin), X-22-161A manufactured by SINETSU KAGAKU KOGYO K.K., SF-8417 manufactured by TORAY-DOW CORNING SILICONE K.K. and the like; and as the one wherein $R_3$ represents a functional group containing an alicyclic epoxy group (referred to hereinafter as epoxy group containing silicone resin), BX16-855B, BX-16-854B manufactured by TORAY-DOW CORNING SILICONE K.K. and the like.

While the molecular weight is not critical, a silicone resin having a molecular weight in the range of about 500 to 30,000, preferably 500 to 10,000, is used.

While these silicone resins are used by only mixing them with (A) the allylated product of the polyvalent phenol and (B) the polymaleimide compound, they are preferably allowed to react preliminarily with (A) the allylated product of the polyvalent phenol or (B) the polymaleimide compound.

The reaction between the hydrogen group-containing silicone resin and the allyl group in the allylated product of the polyvalent phenol as the component (A) is a hydrosilylation reaction, which is easily conducted as usual with use of a platinum catalyst and the like.

The glycidyl group- or alicyclic epoxy group-containing silicone resin may also be allowed to react easily with the hydroxy group in the allylated product of the polyvalent phenol as the component (A) in the presence of a basic catalyst (for example, triethyl-amine or the like).

Furthermore, the amino group-containing silicone resin is allowed to react easily with the maleimide group of the bismaleimide as the component (B) in the composition of the present invention.

These reactions successfully avoid the bleeding of silicone from a cured product and produce a low stress thermosetting resin composition wherein silicone is homogeneously dispersed in the cured product from the standpoint of morphology.

The silicone resin is desirably incorporated in an amount ratio of 3-30 % by weight of the total amount of the resin components (allylated product of the polyvalent phenol (A) the polymaleimide compound (B) + the silicone resin). If the amount of the silicone resin is lower than the above-mentioned ratio, the silicone resin exhibits a poor effect of low stress property; if the silicone resin is incorporated in an amount not lesser than the above-mentioned ratio, curing characteristics and heat resistance are undesirably lowered.

Moreover, two members selected from the allylated product of the polyvalent phenol, allyl etherified polyphenols modified by silicone, polymaleimides modified by silicone, and the polymaleimide resin in the composition according to the present invention may be preliminarily allowed to react to form prepolymers, respectively. Thus, the molding characteristics is further improved and a morphologically homogeneous cured product is obtained, so that the characteristics of the present invention is further improved.

With reference to the process for heat curing the resin composition of the present invention, while curing is permittable even in the absence of a catalyst, it is conducted more easily by the use of a curing accelerator. Such a catalyst include organic phosphine compounds such as triphenylphosphine, tri-4-methylphenylphosphine, tri-4-methoxyphenylphosphine, tributylphosphine, trioctylphosphine and tri-2-cyanoethylphosphine, radical polymerization initiators such as benzoyl peroxide, di-t-butyl peroxide, dicumyl peroxide, lauroyl peroxide, acetyl peroxide, methyl ethyl ketone peroxide, cyclohexanone peroxide, t-butyl hydroperoxide and azobisisobutyronitrile, as well as tertiary amines such as tributylamine, triethylamine and triamylamine, quaternary ammonium salts such as benzyl triethylammonium chloride and benzyl trimethylammonium hydroxide, imidazoles, boron trifluoride complexes, transition metal acetylacetonates and the like without limitation thereto. Among these catalysts, the organic phosphine compounds and imidazoles are particularly preferred.

It is also possible to combine a well-known inhibitor in order to control the curing rate. The inhibitor includes phenols such as 2,6-di-t-butyl-4-methylphenol, 2,2'-methylenebis(4-ethyl-6-t-butylphenol), 4,4'-methylenebis(2,6-di-t-butylphenol), 4.4'-thiobis-(3-methyl-6-t-butylphenol) and hydroquinone monomethyl ether, polyvalent phenols such as hydroquinone, catechol, p-t-butylcatechol, 2,5-di-t-butylhydroquinone, methylhydroquinone, t-butylhydroquinone and pyrogallol, phenothiazine compounds such as phenothiazine, benzo-phenothiazine and acetamidephenothiazine, and N-nitroso-amine compounds such as N-nitrosodiphenylamine and N-nitrosodimethylamine.

Well-known epoxy resins and epoxy-curing agents may be used in combination in the resin composition of the present invention. Examples of the epoxy resins include a novolak epoxy resin derived from a novolak resin which is a reaction product of a phenol such as phenol or o-cresol and formaldehyde, a glycidyl ether compound derived from a phenol having a valency of 3 or more such as phloroglycine, tris(4-hydroxyphenyl)methane or 1,1,2,2-tetrakis(4-hydroxyphenyl)ethane, a diglycidyl ether compound derived from a divalent phenol such as bisphenol A, bisphenol F, hydroquinone or resorcin or from a halogenated bisphenol such as tetrabromobisphenol A, an amine epoxy resin derived from p-aminophenol, m-aminophenol, 4-amino-m-cresol, 6-amino-m-cresol, 4,4'-diaminodiphenylmethane, 3,3'-diaminodiphenylmethane, 4,4'-diaminodiphenyl ether, 3,4'-diaminodiphenyl ether, 1,4-bis(4-aminophenoxy)-benzene, 1,4-bis(3-aminophenoxy)benzene, 1,3-bis(4-aminophenoxy)benzene, 1,3-bis(3-aminophenoxy)benzene, 2,2-bis(4-aminophenoxyphenyl)propane, p-phenylenediamine, m-phenylenediamine, 2,4-toluenediamine, 2,6-toluenediamine, p-xylylenediamine, m-xylylenediamine, 1,4-cyclo-hexanebis(methylamine) or 1,3-cyclohexanebix(-methyl-amine), a glycidyl ester compound derived from an aromatic carboxylic acid such as p-oxybenzoic acid, m-oxybenzoic acid, terephthalic acid or isophthalic acid, a hydantoin epoxy resin derived from 5,5-dimethyl-hydantoin or the like, an alicyclic epoxy resin such as 2,2-bis(3,4-epoxycyclohexyl)propane, 2,2-bis[4-(2,3-epoxypropyl)cyclohexyl]propane, vinylcyclohexene dioxide or 3,4-epoxycyclohexylmethyl-3,4-epoxycyclohexane carboxylate, N,N-diglycidylaniline or the like. One or more of these epoxy resins are used.

Also, as for the epoxy resin-curing agent, a well-known agent is used. Examples of the agent include a novolak resin such as phenol novolak or cresol novolak, an aromatic polyamine such as diaminodiphenylmethane or diaminodiphenylsulfone, an acid anhydride such as pyromellitic dianhydride or benzophenonetetracarboxylic anhydride, without limitation thereto.

It is also possible to add an inorganic filler in the present invention. As the filler used, there are mentioned silica powder, alumina, talc, calcium carbonate, titanium white, clay, asbestos, mica, blood red, glass fiber and the like, and particularly silica powder and alumina are preferred. The inorganic filler on its use for an encapsulant is preferably incorporated in an amount of 25-90% by weight in proportion of the total amount of the resin composition, more preferably in an amount of 60-80% by weight.

In the present invention, there may be added a mold-release agent such as a natural wax, a synthetic wax, a higher fatty acid or a metal salt thereof or a paraffin, a coloring agent such as carbon black, a coupling agent or the like, if necessary. There may be also added a flame-retardant such as antimony trioxide, a phosphorus compound or a brominated epoxy resin.

The resin composition thus obtained is compounded by melt kneading with an ordinary kneading machine such as a roll or a kneader.

The electronic part of the present invention is easily prepared by subjecting the compound to transfer molding or compression molding at a temperature of 160°-200 ° C.

Also, a copper-clad laminate as one of the electronic parts of the present invention is prepared according to a well-known method. For example, a resin varnish obtained by dissolving the aforementioned resin composition into an organic solvent is impregnated into a base and heat treated to give a prepreg sheet, which is then superposed on a copper foil and heat laminate molded to give a copper-clad laminate. As the solvent, there are mentioned methyl ethyl ketone, ethylene glycol monomethyl ether, N,N-dimethylformamide, N-methyl-2-pyrrolidone and the like. As the examples of the base, there are mentioned a woven fabric, unwoven fabric, mat or paper comprising an inorganic or organic fiber such as a glass fiber, a polyester fiber or a polyamide fiber, or a combination thereof.

The heat treatment condition is appropriately determined depending on the kind or amount of a solvent, a catalyst or an additive to be used.

As the heat treatment condition, there is mentioned the press molding at a temperature of 150°-250 °C. under a pressure of 10-100 kg/cm² for 20-300 minutes.

As described above, the thermosetting resin composition of the present invention is excellent in processability and thus produce a cured product having an excellent heat resistance. Furthermore, the electronic part obtained with use of the thermosetting resin composition is very excellent in heat resistance, dimensional stability, low stress characteristics and adhesive properties as compared with conventional known electronic parts and thus has a great industrial value.

The present invention is specifically explained with reference to examples.

The functional group containing silicone resins used in examples are shown in the following:

Silicone (a), molecular weight $M_2 \simeq 3300$

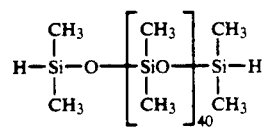

Silicone (b), molecular weight $M_w \simeq 1800$

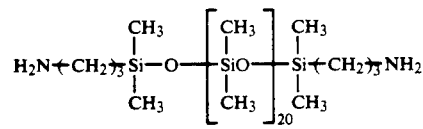

Silicone (c), molecular weight $M_w \simeq 2900$

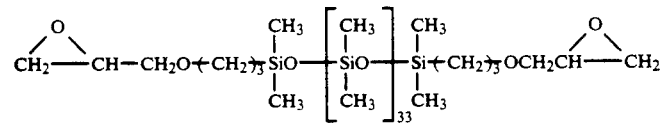

Silicone (d), molecular weight $M_w \simeq 4700$

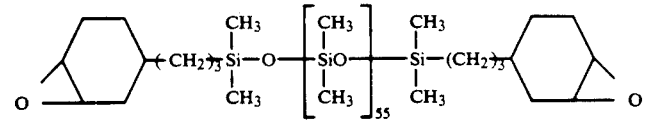

Referential Example 1

Synthesis of a polyvalent phenol as a raw material

Into a reactor equipped with a thermometer, a stirring device and a reflux condenser were charged 431.6 g (4 equivalents) of o-cresol, 122.1 g (1 equivalent) of p-hydroxybenzaldehyde, 3.0 g of p-toluene-sulfonic acid as a catalyst and 872 g of n-heptane as a reaction solvent. After the resin had been completely dissolved, the mixture was heated to a temperature of 105 °C. to carry out azeotropic dehydration. The mixture was maintained at a temperature of 105 °C. for 7 hours and then cooled to room temperature. The reaction product deposited by cooling was filtered, dissolved in 2895 g of methanol at room temperature, washed with water and dried after washing at reduced pressure at 80 °C. for 24 hours to give 260.5 g of a reddish brown powder (OH equivalent: 110.9 g/eq). (which is referred to as TPM-1).

Referential Example 2

Synthesis of an allyl ether compound

Into a reactor equipped with a thermometer, a stirring device, a dropping funnel and a reflux condenser were charged 120 g (1.08 equivalents) of the polyvalent phenol TPM-1 obtained in Referential Example 1, and 420 g of dimethylsulfoxide as a reaction solvent. After the resin had been completely dissolved, 21.9 g (0.54 equivalent) of 99% sodium hydroxide was added and the mixture was sufficiently stirred. After 43.6 g (0.56 equivalent) of allyl chloride had been added dropwise over a period of 1 hour while maintaining the temperature of the reaction system at 40 °C., the temperature was raised up to 50 °C. and maintained for 5 hours. After the dimethylsulfoxide had been removed by distillation, 600 g of methyl isobutyl ketone was charged to dissolve the resin. The solution was washed with water and filtered to remove inorganic salts, and the filtrate was concentrated to give 132.6 g of a reddish brown semisolid resin which was free of a nucleus-substituted allyl group and had an allyl etherification Yield of 50% and an OH equivalent of 262 g/eq, (which is referred to as ALN-1).

Referential Example 3

Synthesis of an allyl ether compound

Reaction was conducted in the same manner as in Referential Example 2 except that the amount of the polyvalent phenol TPM-1 was changed from 120 g (1.08 equivalents) to 60 g (0.54 equivalent), the amount of the dimethylsulfoxide was changed from 420 g to 210 g and the amount of the methyl isobutyl ketone was changed from 600 g to 300 g to obtain 76.3 g of a reddish brown semisolid resin which was free of a nucleus-substituted allyl group and had an allyl etherification yield of 100% and an OH content of 0.2%, (which is referred to as ALN-2).

Referential Example 4

Synthesis of a polyvalent phenol as a raw material

Into a reactor, were charged 215.8 g (2 equivalents) of o-cresol, 122 g (1 equivalent) of p-hydroxy-benzaldehyde, 3.0 g of p-toluenesulfonic acid and 528 g of n-heptane.

A reaction was conducted by azeotropic dehydration at 105° C. for 7 hours in the same manner as in Referential Example 1. After the reaction product was filtered, it was dissolved in 1148 g of methyl isobutyl ketone and washed with water. After separating was made into layers, the oil layer was concentrated to give 249.0 g of a reddish brown semisolid resin which had an OH equivalent of 125.9 g/eq, (which is referred to as TPM-2).

Referential Example 5

Synthesis of an allyl ether compound

Into a reactor, were charged 140 g (1.112 equivalents) of the polyvalent phenol TPM-2 obtained in Referential Example 4, 322 g of dimethylsulfoxide as a reaction solvent, 22.2 g (0.556 equivalent) of 99% sodium hydroxide and 44.8 g (0.586 equivalent) of allyl chloride, and a reaction was conducted in the same manner as in Referential Example 2 to give 140.6 g of a reddish brown semisolid resin which was free of a nucleus-substituted allyl group and had an allyl etherification yield of 50% (calculated from the aromatic protons and allyl group protons in $^1$H-NMR), (which is referred to as ALN-3).

Referential Example 6

Synthesis of a polyvalent phenol as a raw material

Into a reactor, were charged 656.8 g (4 equivalents) of 2-t-butyl-5-methylphenol, 122.1 g (1 equivalent) of p-hydroxybenzaldehyde, 3.0 g of p-toluene-sulfonic acid as a catalyst and 1300 g of n-heptane as a reaction solvent, and a reaction was conducted in the same manner as in Referential Example 1. The reaction product deposited by cooling was separated by filtration, dissolved in 4400 g of methanol and treated in the same manner as in Referential Example 1 to give 367.5 g of a reddish brown semisolid resin which had an OH equivalent of 144.1 g/eq, (which is referred to as TPM-3).

Example 7

Synthesis of an allyl ether compound

Into a reactor, were charged 70 g (0.487 equivalent) of the polyvalent phenol TPM-2 obtained in Referential Example 6, 162 g of dimethylsulfoxide as a reaction solvent, 9.84 g (0.246 equivalent) of 99% sodium hydroxide and 19.8 g (0.259 equivalent) of allyl chloride, and a reaction was conducted in the same manner as in Referential Example 2 to give 71.9 g of a reddish brown semisolid resin which was free of a nucleus-substituted allyl group and had an allyl etherification yield of 60% (calculated from the aromatic protons and allyl group protons in $^1$H-NMR), (which is referred to as ALN-4).

Referential Example 8

Synthesis of a polyvalent phenol as a raw material

Reaction was conducted in the same manner as in Referential Example 6 except that the charged amount of 2-t-butyl-5-methylphenol was changed from 656.8 g (4 equivalents) to 328.4 g (2 equivalents) to give 293.2 g of a reddish brown semisolid resin which had an OH equivalent of 140.0 g/eq, (which is referred to as TPM-4).

Referential Example 9

Synthesis of an allyl ether compound

Into a reactor, were charged 100.0 g (0.714 equivalent) of the polyvalent phenol TPM-4 obtained in Referential Example 8, 230 g of dimethylsulfoxide as a reaction solvent, 14.4 g (0.361 equivalent) of 99% sodium hydroxide and 29.1 g (0.380 equivalent) of allyl chloride, and a reaction was conducted in the same manner as in Referential Example 2 to give 105.0 g of a reddish brown semisolid resin which was free of a nucleus-substituted allyl group and had an allyl etherification yield of 48% (calculated from the aromatic protons and allyl group protons in $^1$H-NMR), (which is referred to as ALN-5).

Referential Example 10

Synthesis of a polyvalent phenol as a raw material

Into a reactor, were charged 492.6 g (3 equivalents) of 2-t-butyl-5-methylphenol, 108 g (1 equivalent) of m-cresol, 122.1 g (1 equivalent) of p-hydroxybenzaldehyde, 3.0 g of p-toluenesulfonic acid and 528 g of n-heptane and a reaction was conducted in the same manner as in Referential Example 1. The reaction product was treated in the same manner as in Referential Example 4 to give 394.7 g of a reddish brown semisolid resin which had an OH equivalent of 131.6 g/eq, (which is referred to as TMP-5).

Referential Example 11

Synthesis of an allyl ether compound

Into a reactor, were charged 100 g (0.760 equivalent) of the polyvalent phenol TPM-5 obtained in Referential Example 10, 230 g of dimethylsulfoxide as a reaction solvent, 15.4 g (0.384 equivalent) of 99% sodium hydroxide and 30.9 g (0.404 equivalent) of allyl chloride, and a reaction was conducted in the same manner as in Referential Example 2 to give 107 g of a reddish brown semisolid resin which was free of a nucleus-substituted allyl group and had an allyl etherification yield of 37% (calculated from the aromatic protons and allyl group protons in $^1$H-NMR), (which is referred to as ALN-6).

Referential Example 12

Modification by silicone

Into a reactor, were charged 100 g of ALN-1 obtained in Referential Example 2, 2 g of a platinum catalyst (platinum black containing 1% Pt) and 331 g of xylene. After water had been completely removed from the reaction system by azeotropic dehydration, 28.1 g of the silicone resin (a) was added dropwise under refluxing xylene over a period of about 1 hour and the mixture was maintained at the temperature for about 5 hours under the reflux of xylene. After the solution was then filtered to remove completely the platinum catalyst, a product modified by silicone was obtained by concentrating the filtrate (referred to as the modified product (a)).

Referential Example 13

Modification by silicone

Into a reactor, were charged 100 g of N,N'-diphenylmethane bismaleimide (referred to hereinafter as BMI) and 369 g of 1,4-dioxane as a reaction solvent, and the mixture was heated to a temperature of 100° C. to dissolve completely BMI. Then, 58 g of the silicone resin (b) was added dropwise over a period of about 1 hour, and the mixture was maintained at the temperature for about 1 hour. The dioxane was removed by distillation to give a product modified by silicone (referred to as the modified product (b)).

Referential Example 14

Modification by silicone

Into a reactor, were charged 100 g of ALN-1 obtained in Referential Example 2, 5 g of triethylamine and 331 g of xylene as a reaction solvent. After the mixture was heated to a temperature of 140° C. to dissolve completely the resin, 28.1 g of the silicone resin (c) was added dropwise over a period of about 1 hour and the mixture was maintained at the temperature for about 15 hours. The xylene and the triethylamine were then removed by distillation to give a product modified by silicone (referred to as the modified product (c)).

Referential Example 15

Modification by silicone

Into a reactor, were charged 100 g of ALN-3 obtained in Referential Example 5, 5 g of triethylamine and 331 g of xylene as a reaction solvent. After the mixture was heated to a temperature of 140° C. to dissolve completely the resin, 25.9 g of the silicone resin (d) was added dropwise over a period of about 1 hour and the mixture was maintained at the temperature for about 20 hours. The xylene and the triethylamine were then removed by distillation to give a product modified by silicone (referred to as the modified product (d)).

Examples 1–11

The allylated products of the polyvalent phenols, the modified products (a)–(d) obtained in Referential Examples and BMI were blended at ratios specified in Table 1, melt mixed by heating at about 130° C., maintained at this temperature for 30 minutes and then immediately cooled to give prepolymers, respectively. The prepolymers thus obtained, curing accelerators, fillers, coupling agents and mold release agents were melt kneaded with a heat roll according to the ratios specified in Table 1 under the conditions at 50°–120° C. for 5 minutes and ground after cooling to give compounds, respectively. Next, these compounds were transfer molded under the conditions at 175° C. at 70 kg/cm$^2$ for 3 minutes and postcured at 200° C. for 5 hours, and the physical properties of the molded products were evaluated. The results are shown in Table 2.

Comparative Example 1

An o-cresol novolak epoxy resin (epoxy equivalent: 195 g/eq), a phenol novolak resin (OH equivalent: 110 g/eq), a curing accelerator, a filler, a mold release agent and a coupling agent were kneaded according to the ratio specified in Table 1 in the same manner as in Examples to give compounds. The compounds were then transfer molded under the conditions at 175° C. at 70 kg/cm$^2$ for 5 minutes, postcured at 180° C. for 5 hours, and the physical properties of the molded products were evaluated. The results are shown in Table 2.

Examples 12–19

The allylated products of the polyvalent phenols obtained in Referential Examples and BMI were blended at ratios specified in Table 3, melt mixed by heating at 150° C.–160° C., maintained with stirring at this temperature for 10 to 20 minutes to give prepolymers of which viscosities were in the range of 6–7 poise. A 60 parts each of the prepolymers was dissolved in 40 parts of N,N-dimethylformamide to give a resin varnish in which N,N'-diphenylmethane bismaleimide was not deposited. The varnish was impregnated in a glass cloth (manufactured by KANEBO K.K., KS-1600, treated with aminosilane), heat treated in an oven at 160° C. for 10–20 minutes to give a prepreg. Six prepregs were superposed on a copper foil (manufactured by FURUKAWA CIRCUIT FOIL K.K., TTAI treated, thickness: 35 μm) and press molded at a pressure of 50 kg/cm$^2$ at 200° C. for 2 hours to give a copper-clad laminate having a thickness of 1 mm. The physical properties of the laminates were measured according to JIS-C-6431 to give results shown in Table 3. For the measurement of bending strength at 240° C., laminates molded with 8 aforementioned prepregs under the same condition and having thickness of 1.6 mm were used.

Comparative Example 2

A varnish obtained by dissolving 60 parts of Kerimid® 601 (manufactured by Rhone Poulenc) in 40 parts of N,N-dimethylformamide was impregnated in a glass cloth and heat treated in the same manner as Examples to form a prepreg, which was press molded at 200° C. at 50 kg/cm$^2$ for 2 hours to give a copper-clad laminate. The physical properties of the laminate are shown in Table 3.

TABLE 1

| | Example | | | | | | | | | | | Comparative |
|---|---|---|---|---|---|---|---|---|---|---|---|---|
| | 1 | 2 | 3 | 4 | 5 | 6 | 7 | 8 | 9 | 10 | 11 | Example 1 |
| ALN-1 | 26.8 | — | — | — | — | — | — | 24.9 | — | — | — | — |
| ALN-2 | — | 29.7 | — | — | — | — | — | — | — | — | — | — |
| ALN-3 | — | — | 29.0 | — | — | — | — | — | — | — | — | — |
| ALN-4 | — | — | — | 33.2 | — | — | — | — | — | — | — | — |
| ALN-5 | — | — | — | — | 30.6 | — | — | — | — | — | — | — |
| ALN-6 | — | — | — | — | — | 32.0 | — | — | — | — | — | — |
| Modified product (a) | — | — | — | — | — | — | 31.9 | — | — | — | 31.9 | — |
| Modified product (b) | — | — | — | — | — | — | — | 19.1 | — | — | 13.6 | — |
| Modified product (c) | — | — | — | — | — | — | — | — | 31.9 | — | — | — |
| Modified product (d) | — | — | — | — | — | — | — | — | — | 34.0 | — | — |
| BMI | 73.2 | 70.3 | 71.0 | 66.8 | 69.4 | 68.0 | 68.1 | 56.0 | 68.1 | 66.0 | 54.5 | — |
| ESCN-195XL | — | — | — | — | — | — | — | — | — | — | — | 100 |
| Phenol novolak | — | — | — | — | — | — | — | — | — | — | — | 56 |
| Triphenylphosphine | 0.8 | 0.8 | 0.8 | 0.8 | 0.8 | 0.8 | 0.8 | 0.8 | 0.8 | 0.8 | 0.8 | 0 |

TABLE 1-continued

|  | Example | | | | | | | | | | | Comparative Example 1 |
|---|---|---|---|---|---|---|---|---|---|---|---|---|
|  | 1 | 2 | 3 | 4 | 5 | 6 | 7 | 8 | 9 | 10 | 11 |  |
| 4-Methylimidazole | 0.7 | 0.7 | 0.7 | 0.7 | 0.7 | 0.7 | 0.7 | 0.7 | 0.7 | 0.7 | 0.7 | — |
| 1,8-Diazabicyclo-(5,4,0)undecene-7 | — | — | — | — | — | — | — | — | — | — | — | 2 |
| HOECHST WAX OP | 0.7 | 0.7 | 0.7 | 0.7 | 0.7 | 0.7 | 0.7 | 0.7 | 0.7 | 0.7 | 0.7 | 1 |
| Silane coupling agent A | 2 | 2 | 2 | 2 | 2 | 2 | 2 | 2 | 2 | 2 | 2 | — |
| Silane coupling agent B | — | — | — | — | — | — | — | — | — | — | — | 2 |
| Molten silica | 233 | 233 | 233 | 233 | 233 | 233 | — | — | — | — | — | 364 |
| Spherical molten silica | — | — | — | — | — | — | 317 | 317 | 317 | 317 | 317 | — |

(Numerals in the table represent parts by weight)
BMI: manufactured by SUMITOMO CHEMICAL CO., LTD., Bestlex ® BH-180.
ESCN-195XL: manufactured by SUMITOMO CHEMICAL CO., LTD., o-cresol novolak type epoxy resin (epoxy equivalent: 195 g/eq).
Phenol novolak resin: OH equivalent: 110 g/eq, softening point: 90° C.
Silane coupling agent A: manufactured by SHINETSU SILICONE K.K., KBM-573.
Silane coupling agent B: manufactured by TORAY-DOW CORNING SILICONE K.K., SH-6040.
Molten silica: manufactured by DENKI KAGAKU KOGYO, K.K., FS-891.
Spherical molten silica: manufactured by DENKI KAGAKU KOGYO K.K., FB-90.

TABLE 2

|  | Example | | | | | |
|---|---|---|---|---|---|---|
|  | 1 | 2 | 3 | 4 | 5 | 6 |
| Spiral flow* (inch) 175° C. × 70 kg/cm² | 38 | 40 | 35 | 37 | 38 | 37 |
| Barcol Hardness (Barcol 935)** | | | | | | |
| 175° C. × 90 sec | 81 | 65 | 80 | 80 | 81 | 83 |
| 175° C. × 180 sec | 86 | 72 | 84 | 83 | 84 | 84 |
| Glass transition temperature, TG***(°C.) | 255 | 283 | 256 | 253 | 250 | 255 |
| Thermal expansion coefficient (TEC)*** × 10⁻⁵ °C.⁻¹ | 1.8 | 1.7 | 1.9 | 1.7 | 1.8 | 1.9 |
| Flexural strength (kg/mm²) | | | | | | |
| 20° C. | 14.8 | 14.5 | 14.4 | 14.2 | 14.4 | 14.3 |
| 240° C. | 6.5 | 8.1 | 6.1 | 6.6 | 6.8 | 6.3 |
| Flexural modulus (kg/mm²) | | | | | | |
| 20° C. | 1610 | 1620 | 1580 | 1600 | 1630 | 1610 |
| 240° C. | 720 | 750 | 700 | 710 | 700 | 720 |
| Volume resistivity (Ωcm), Pressure cooker, 121° C. × 100% RH | | | | | | |
| Ordinary state | $6.8 \times 10^{16}$ | $6.1 \times 10^{16}$ | $5.8 \times 10^{16}$ | $5.5 \times 10^{16}$ | $6.0 \times 10^{16}$ | $5.1 \times 10^{16}$ |
| 100 hours | $1.4 \times 10^{15}$ | $1.8 \times 10^{15}$ | $1.3 \times 10^{15}$ | $1.2 \times 10^{15}$ | $1.2 \times 10^{15}$ | $1.3 \times 10^{15}$ |
| 300 hours | $6.1 \times 10^{14}$ | $7.2 \times 10^{14}$ | $5.8 \times 10^{14}$ | $6.0 \times 10^{14}$ | $5.5 \times 10^{14}$ | $4.3 \times 10^{14}$ |
| 500 hours | $4.5 \times 10^{14}$ | $5.1 \times 10^{14}$ | $3.9 \times 10^{14}$ | $4.2 \times 10^{14}$ | $5.0 \times 10^{14}$ | $3.9 \times 10^{14}$ |
| Water absorption (%), Pressure cooker, 121° C. × 100% RH | | | | | | |
| 100 hours | 1.05 | 0.99 | 1.00 | 1.06 | 1.03 | 0.98 |
| 300 hours | 1.17 | 1.10 | 1.07 | 1.17 | 1.15 | 1.08 |
| 500 hours | 1.22 | 1.17 | 1.18 | 1.23 | 1.21 | 1.20 |
| Heat resistance of solder**** (number of crack) | 0/10 | 0/10 | 0/10 | 0/10 | 0/10 | 0/10 |

|  | Example | | | | | Comparative Example 1 |
|---|---|---|---|---|---|---|
|  | 7 | 8 | 9 | 10 | 11 |  |
| Spiral flow* (inch) 175° C. × 70 kg/cm² | 28 | 26 | 30 | 28 | 27 | 43 |
| Barcol Hardness (Barcol 935)** | | | | | | |
| 175° C. × 90 sec | 65 | 65 | 67 | 64 | 65 | 80 |
| 175° C. × 180 sec | 71 | 72 | 77 | 72 | 72 | 84 |
| Glass transition | 251 | 260 | 255 | 264 | 254 | 158 |

TABLE 2-continued

| | | | | | | |
|---|---|---|---|---|---|---|
| temperature, TG*** (°C.) | | | | | | |
| Thermal expansion coefficient (TEC)*** × $10^{-5}$ °C.$^{-1}$ | 1.3 | 1.1 | 1.2 | 1.1 | 1.0 | 2.4 |
| Flexural strength (kg/mm$^2$) | | | | | | |
| 20° C. | 14.5 | 12.5 | 13.1 | 13.8 | 14.5 | 15.6 |
| 240° C. | 5.3 | 5.2 | 4.8 | 5.0 | 5.3 | 1.8 |
| Flexural modulus (kg/mm$^2$) | | | | | | |
| 20° C. | 1250 | 1280 | 1190 | 1210 | 1110 | 1400 |
| 240° C. | 630 | 680 | 590 | 610 | 550 | 110 |
| Volume resistivity (Ωcm), Pressure cooker, 121° C. × 100% RH | | | | | | |
| Ordinary state | $5.2 \times 10^{16}$ | $6.1 \times 10^{16}$ | $5.8 \times 10^{16}$ | $7.1 \times 10^{16}$ | $6.5 \times 10^{16}$ | $8.4 \times 10^{16}$ |
| 100 hours | $1.0 \times 10^{15}$ | $1.3 \times 10^{15}$ | $1.1 \times 10^{15}$ | $1.5 \times 10^{15}$ | $1.8 \times 10^{15}$ | $1.6 \times 10^{15}$ |
| 300 hours | $3.5 \times 10^{14}$ | $6.2 \times 10^{14}$ | $4.2 \times 10^{14}$ | $7.1 \times 10^{14}$ | $7.2 \times 10^{14}$ | $4.3 \times 10^{14}$ |
| 500 hours | $2.1 \times 10^{14}$ | $4.1 \times 10^{14}$ | $2.2 \times 10^{14}$ | $5.2 \times 10^{14}$ | $5.3 \times 10^{14}$ | $4.2 \times 10^{14}$ |
| Water absorption (%), Pressure cooker, 121° C. × 100% RH | | | | | | |
| 100 hours | 1.02 | 0.95 | 1.01 | 0.98 | 0.90 | 0.86 |
| 300 hours | 1.10 | 1.07 | 1.08 | 1.09 | 1.01 | 1.00 |
| 500 hours | 1.21 | 1.15 | 1.19 | 1.20 | 1.12 | 1.08 |
| Heat resistance of solder**** (number of crack) | 0/10 | 0/10 | 0/10 | 0/10 | 0/10 | 10/10 |

*Spiral flow: EMMI 1-66 REVISION A
**Barcol Hardness: ASTM D 2583-67
***TMA method with use of a thermal analyzer model DT-40, manufactured by SHIMADZU SEISAKUSHO, LTD.
**** QFP 84 pin, 34 mmt, IC chip 10 × 10 mm; packages in which cracking has been generated after the treatment in a pressure cooker at 121° C. at 100% RH for 24 hours and the dipping into a solder bath at 260° C. for 10 seconds.

TABLE 3

| | Physical properties of laminates | | | | | | | | Comparative Example 2 |
|---|---|---|---|---|---|---|---|---|---|
| | Example | | | | | | | | |
| | 12 | 13 | 14 | 15 | 16 | 17 | 18 | 19 | |
| ALN-1 (parts by weight) | 26.8 | — | — | — | — | — | 25.5 | — | |
| ALN-2 (parts by weight) | — | 29.7 | — | — | — | — | — | 28.2 | |
| ALN-3 (parts by weight) | — | — | 29.0 | — | — | — | — | — | |
| ALN-4 (parts by weight) | — | — | — | 33.2 | — | — | — | — | |
| ALN-5 (parts by weight) | — | — | — | — | 30.6 | — | — | — | |
| ALN-6 (parts by weight) | — | — | — | — | — | 32.0 | — | — | |
| BMI (parts by weight) | 73.2 | 70.3 | 71.0 | 66.8 | 69.4 | 68.0 | 69.5 | 66.8 | |
| ESCN-195XL (parts by weight) | — | — | — | — | — | — | 5 | 5 | |
| Glass transition temperature Tg*, (°C.) | 240 | 255 | 240 | 238 | 232 | 235 | 225 | 230 | 204 |
| Thermal expansion ratio (20° C.-260° C.)*, (%) | 1.42 | 1.40 | 1.45 | 1.66 | 1.58 | 1.56 | 1.61 | 1.83 | 2.29 |
| Peeling strength of copper foil (kg/cm) | 1.4 | 1.2 | 1.5 | 1.3 | 1.4 | 1.3 | 1.6 | 1.6 | 1.2 |
| Flexural strength at 240° C., (kg/mm$^2$) | 32.1 | 38.2 | 32.5 | 32.0 | 29.8 | 28.5 | 26.3 | 27.7 | 23.3 |
| Heat resistance of solder, at 300° C. | | | | | | | | | |
| Ordinary state | >3 min | >3 min | >3 min | >3 min | >3 min | >3 min | >3 min | >3 min | 2 min |
| 2 hours after boiling | >3 min | >3 min | >3 min | >3 min | >3 min | >3 min | >3 min | >3 min | 1 min plus 40 sec. |

*According to the TMA method with use of a thermal analyzer model DT-40, manufactured by SHIMADZU SEISAKUSHO, LTD.

We claim:
1. A thermosetting resin composition comprising
(A) an allyl etherified compound obtained by allyl etherification of the hydroxyl groups of a polyvalent phenol represented by the following formula (I):

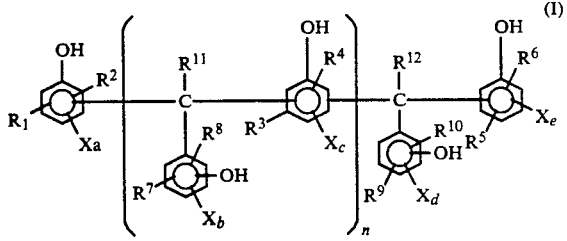

wherein substituents $R^1$–$R^6$ each represent a hydrogen atom or a saturated alkyl group having 1 to 6 carbon atoms, substituents $R^7$–$R^{12}$ each represent a hydrogen atom, a saturated alkyl group having 1 to 4 carbon atoms or an alkoxy group having 1 to 4 carbon atoms, $X_a$–$X_e$ each represent a hydrogen atom, a chlorine atom or a bromine atom, and the average repeating unit number n denotes a numeral from 0 to 5, which has an allyl etherification rate of the phenolic hydroxyl group in the range of 20–100% and (B) a polymaleimide compound containing two or more malemide groups in the molecule.

2. A thermosetting resin composition according to claim 1 wherein the (A) is a compound of the formula (I) where $R^1$–$R^6$ each is a hydrogen atom or a saturated alkyl group having 1–4 carbon atoms, $R^7$–$R^{12}$ each is a hydrogen atom, a methyl group or an alkoxy group having one carbon atom, $X_a$–$X_e$ each is a hydrogen atom, and n is a numeral of zero to five, and the (B) is a polymaleimide compound having two or more maleimide groups in the molecule.

* * * * *